United States Patent
Lu et al.

(10) Patent No.: US 6,500,766 B2
(45) Date of Patent: Dec. 31, 2002

(54) POST-CLEANING METHOD OF A VIA ETCHING PROCESS

(75) Inventors: Hungyueh Lu, Hsinchu (TW); Hong-Long Chang, Hsinchu (TW); Fang-Fei Liu, Hsinchu Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 09/832,267

(22) Filed: Apr. 11, 2001

(65) Prior Publication Data

US 2002/0081859 A1 Jun. 27, 2002

(51) Int. Cl.[7] .................. H01L 21/302; H01L 21/4763
(52) U.S. Cl. .................. 438/706; 438/637; 438/672; 438/704; 438/710; 438/711; 438/906
(58) Field of Search .................. 438/637, 672, 438/704, 706, 710, 707, 711, 712, 725, 714, 745, 906

(56) References Cited

U.S. PATENT DOCUMENTS

| | | | |
|---|---|---|---|
| 5,756,401 A | * 5/1998 | Iizuka | 438/719 |
| 5,795,831 A | * 8/1998 | Nakayama et al. | 438/714 |
| 5,882,489 A | * 3/1999 | Bersin et al. | 204/192.35 |
| 6,030,901 A | * 2/2000 | Hopper | 438/711 |
| 6,180,518 B1 | * 1/2001 | Layadi et al. | 438/639 |
| 6,277,733 B1 | * 8/2001 | Smith | 438/636 |

* cited by examiner

Primary Examiner—Carl Whitehead, Jr.
Assistant Examiner—Maria Guerrero
(74) Attorney, Agent, or Firm—Birch, Stewart, Kolasch & Birch, LLP

(57) ABSTRACT

A post-cleaning method of a via etching process for cleaning a wafer, the wafer having a tungsten (W) layer, an oxide layer covered on the tungsten layer, a photoresist layer patterned on the oxide layer, and a via passing through the photoresist layer and the oxide layer until a predetermined area of the tungsten layer is exposed, the cleaning method has the steps of: (a) performing a photoresist strip process to remove the photoresist layer; (b) performing a dry cleaning process which uses $CF_4$ and $N_2H_2$ as the main reactive gas; and (c) performing a water-rinsing process.

13 Claims, 4 Drawing Sheets

POST-CLEANING METHOD OF A VIA ETCHING PROCESS

BACKGROUND OF THE INVENTION

1. Field of the Invention

The present invention relates in general to a cleaning method, in particular, the present invention relates to a post-cleaning method of a via etching process.

2. Description of the Related Art

In the semiconductor processing for pursuing the goal of minute line width and high integration, the product yield is greatly concerned with particles. In particular, during a via etching process, the residues remaining in the via will cause the electrical-connecting property between metal layers to deteriorate.

Please refer to FIG. 1 and FIG. 2. FIG. 1 is a cross-sectional schematic diagram of a via according to the prior art. FIG. 2 is a flow chart of a post-cleaning method of a via etching process according to the prior art. A wafer 10 comprises a substrate 12, a metal layer 14 formed on the substrate 12, an oxide layer 16 covered on the metal layer 14, and a photoresist layer 18 coated on the oxide layer 16. By using a dry etching process, a via 20 is patterned to pass through the photoresist layer 18 and the oxide layer 16 till exposing a predetermined area of the metal layer 14. In a post-cleaning method of the via etching process, the step 22 of a photoresist strip process is firstly performed to remove the photoresist layer 18 by a dry etching process in a plasma reactor, wherein the hydrocarbon inside the photoresist layer 18 is reacted with oxygen plasma to be stripped off and the produced gas, such as CO, $CO_2$ and $H_2O$ is pumped by a vacuum system. However, the photoresist strip process also produces polymer residues and which mostly remain in the via 20. For this reason, the step 24 of a wet cleaning process is performed for cleaning off the polymer residues. In general, the wafer 10 is dipped into a sink filled with a specific etching solution, such as ACT, EKC or other alkaline compounds, on an appropriate condition of dipping time, temperature and solution concentration so as to make the polymer residues react with the etching solution to be removed off. Finally, at the step 26 of a water-rinsing process, the wafer 10 is turned vertically to ensure the fringe of the wafer 10 being cleaned off, and then the wafer 10 is dipped into deionized water to clean off the remaining etching solution.

Nevertheless, the wet cleaning method that utilizes the chemicals such as ACT and EKC with high waste volume encounters problems such as increasing cost of the chemicals and a shortage of chemical resources. It does not conform to expectations for the cost considerations of mass production. Also, since dipping the wafer 10 into the etching solution consumes a period time to make the polymer residues completely react with the etching solution, the overall via etching process period is increased.

SUMMARY OF THE INVENTION

Therefore, the present invention provides a post-cleaning method of a via etching process, which substitutes a dry cleaning process for the wet cleaning process to solve the above-mentioned problems.

A post-cleaning method of a via etching process for cleaning a wafer, the wafer comprising a tungsten (W) layer, an oxide layer covered on the tungsten layer, a photoresist layer patterned on the oxide layer, and a via passing through the photoresist layer and the oxide layer till exposing a predetermined area of the tungsten layer, the cleaning method comprises the steps of: (a) performing a photoresist strip process to remove the photoresist layer; (b) performing a dry cleaning process which uses $CF_4$ and $N_2H_2$ as the main reactive gas; and (c) performing a water-rinsing process.

It is an advantage of the present invention that since the dry cleaning process substitutes the wet cleaning process to remove the polymer residues without using costly and rare alkaline compounds, the production cost is substantially decreased. Also, the dry cleaning process can quickly remove the polymer residues and the wafer needs not to be turned vertically before dipping into deionized water, so the overall post-clean process becomes more efficient. Furthermore, the photoresist strip process and the dry cleaning process can be performed in-situ; therefore this will facilitate the post-clean process.

This and other objectives of the present invention will no doubt become obvious to those of ordinary skill in the art after having read the following detailed description of the preferred embodiment, which is illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1:
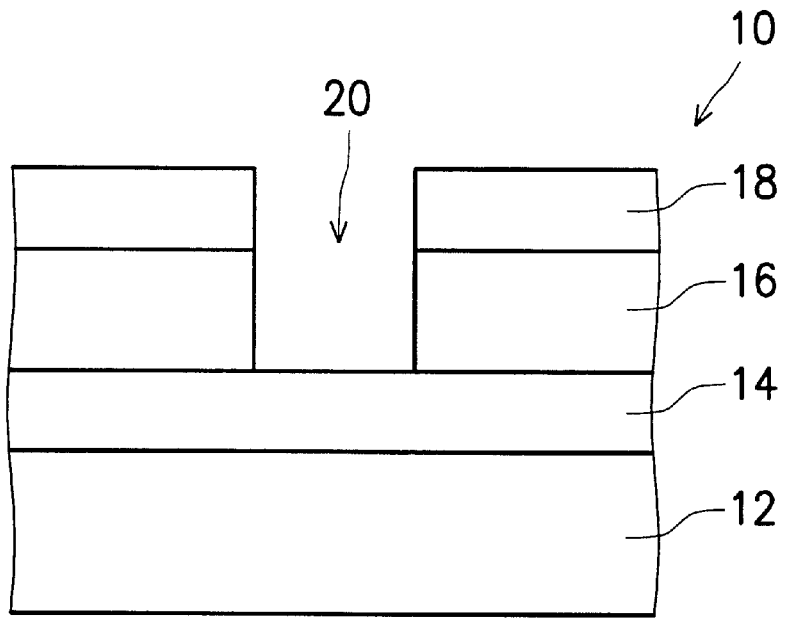
FIG. 1 is a cross-sectional schematic diagram of a via according to the prior art.
Figure 2:
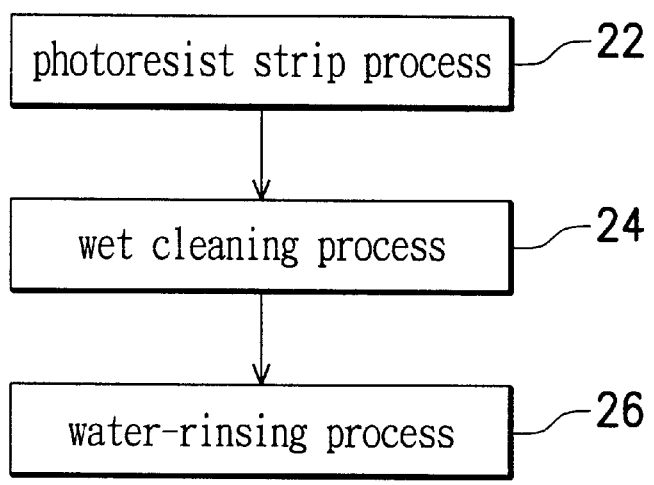
FIG. 2 is a flow chart of a post-cleaning method of a via etching process according to the prior art.
Figure 3A:
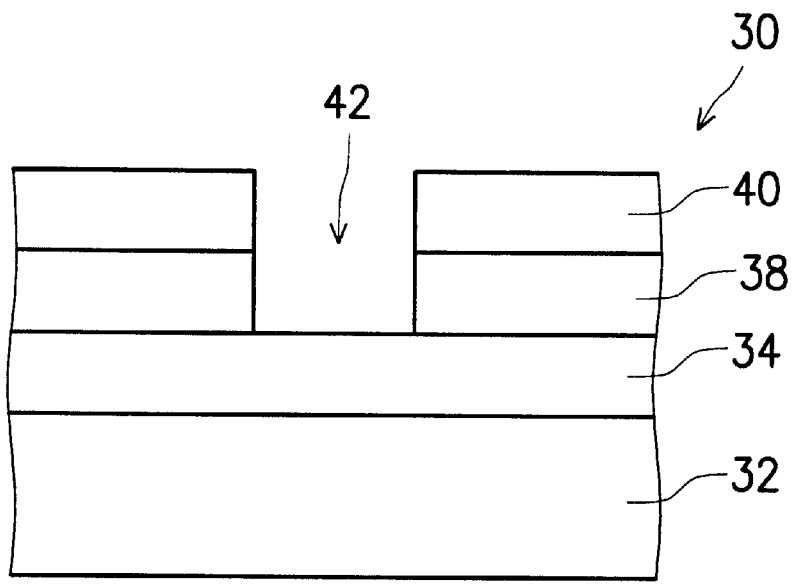
FIGS. 3A to 3D are cross-sectional schematic diagrams of a cleaning method of a via etching process according to the present invention.
Figure 3B:
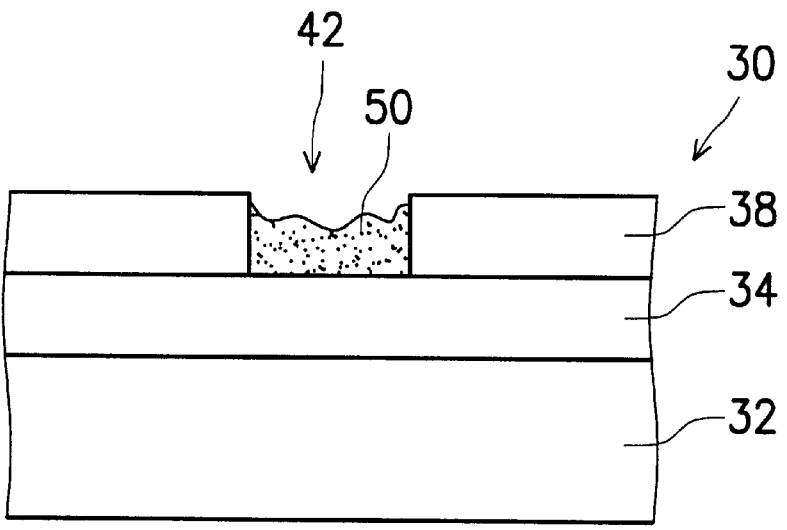
Figure 3C:
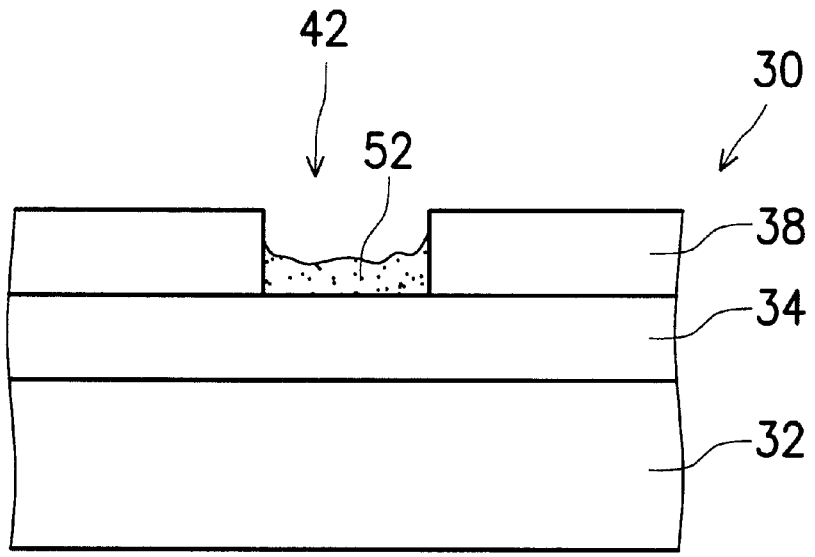
Figure 3D:
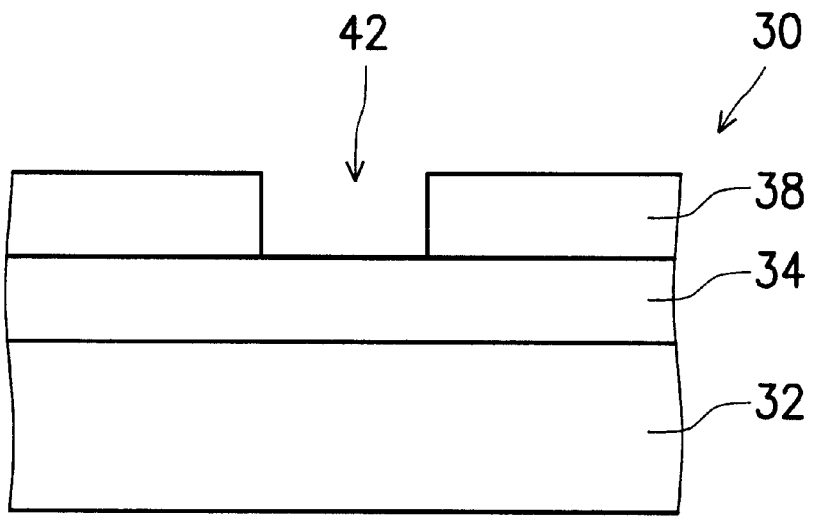
Figure 4:
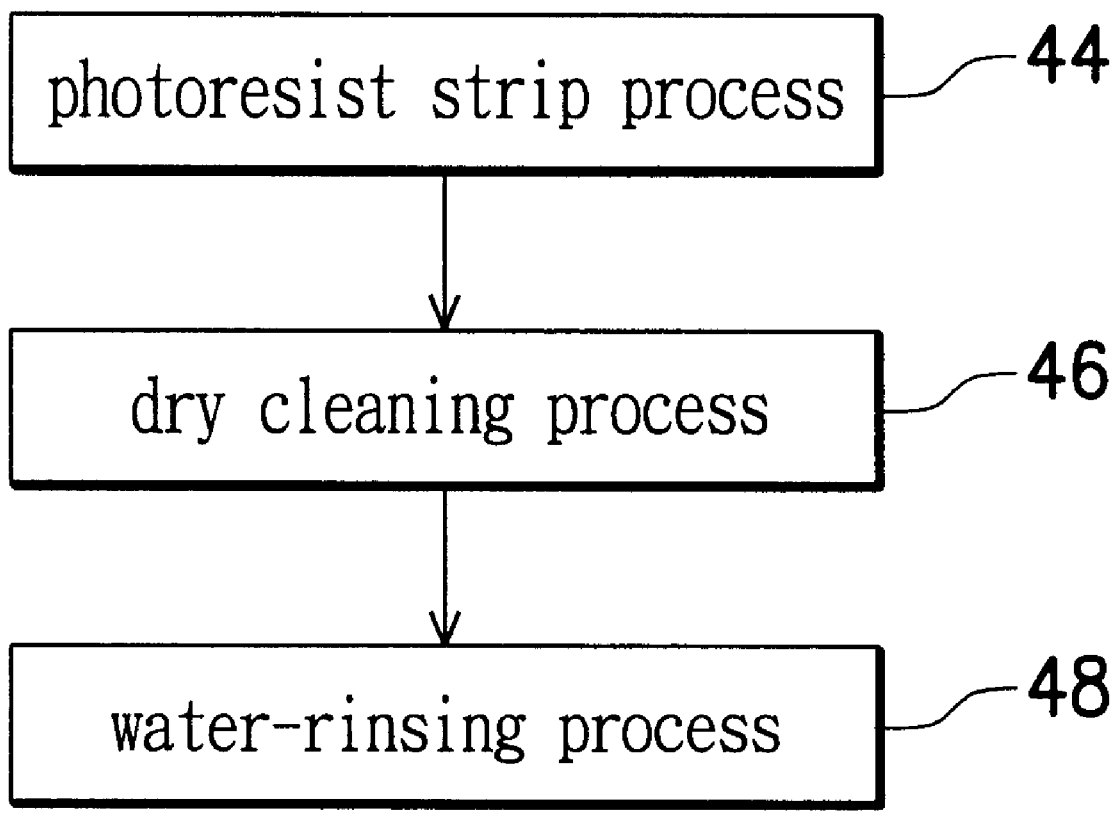
FIG. 4 is a flow chart of a post-cleaning method of the via etching process according to the present invention.

Please refer to FIG. 3 and FIG. 4. FIGS. 3A to 3D are cross-sectional schematic diagrams of a cleaning method of a via etching process according to the present invention. FIG. 4 is a flow chart of a post-cleaning method of the via etching process according to the present invention. As shown in FIG. 3A, a wafer 30 comprises a substrate 32, a tungsten (W) layer 34 formed on the substrate 32, an oxide layer 38 covered on the tungsten layer 34, a photoresist layer 40 coated on the oxide layer 38, and a via 42. The oxide layer 38 is preferably made of TEOS-oxide. The via 42 is preferably fabricated by a dry etching process to pass through the photoresist layer 40 and the oxide layer 38 until a predetermined area of the tungsten layer 34 is exposed and used as an etch stop layer.

As shown in FIG. 4, in the post-cleaning method of the present invention, the step 44 of a photoresist strip process is firstly performed to remove the photoresist layer 40 by a dry etching process in a plasma reactor, wherein the hydrocarbon inside the photoresist layer 40 is reacted with oxygen plasma to be stripped off, the produced gas, such as CO, $CO_2$ and $H_2O$ is pumped by a vacuum system, and the produced polymer residues 50 remain in the via 42, as shown in FIG. 3B. Then, the step 46 of a dry cleaning process is performed to remove the polymer residues 50 by a dry etching process, wherein the operation conditions are 10~20 seconds, 200°

C.~300° C., 500 mT, 700 W~900 W of -wave power, 80 W~120 W of RF power. As to the key point, it is preferred to use $CF_4$ and $N_2H_2$ as the main reactive gas combined with minor reactive gases, such as inert gas, $N_2$ and $H_2$ wherein the proportion of $CF_4$ to the overall reactive gases is between ½ and ⅙, the flow rate of $CF_4$ is about 40~200 sccm and the flow rate of $N_2H_2$ is about 100~500 sccm. Therefore, at the same time the polymer residues 50 are removed, $CF_4$ can react with $WO_x$ to form volatile gases, such as $WF_6$, $WF_x$, CO and $CO_2$, and $N_2H_2$ can react with W to form water-solutable residues 52 including $H_2O_4W$, $H_4N_2$, $H_2N_2O_2$ and $NH_3$, as shown in FIG. 3C. Although those volatile gases are pumped by a vacuum system, the water-solutable residues 52 still remain in the via 42. Finally, at the step 48 of a water-rinsing process, the wafer 30 is directly dipped into deionized water to make the water-solutable residues 52 immediately dissolve in deionized water, and thereby all residues remaining in the via 42 are cleaned off, as shown in FIG. 3D.

Compared with the prior post-cleaning method, in the post-cleaning method of the via etching process according to the present invention, the dry cleaning process substitutes the wet cleaning process to remove the polymer residues 50 without using costly and rare alkaline compounds, such as ACT and EKC. Hence, the production cost is substantially decreased. Also, the dry cleaning process can quickly remove the polymer residues 50 and the wafer 30 does not need to be turned vertically before dipping into deionized water, so the overall post-clean process becomes more efficient. Furthermore, the photoresist strip process and the dry cleaning process can be in-situ performed to remove the photoresist layer 40 and the polymer residues 50 in sequence by adjusting the operation factors of the plasma reactor to an appropriate condition. This will facilitate the post-clean process.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A post-cleaning method of a via etching process for cleaning a wafer, the wafer comprising a tungsten (W) layer, an oxide layer covered on the tungsten layer, a photoresist layer patterned on the oxide layer, and a via passing through the photoresist layer and the oxide layer until a predetermined area of the tungsten layer is exposed, the cleaning method comprising the steps of:

(a) performing a photoresist strip process to remove the photoresist layer;
    (b) performing a dry cleaning process which uses $CF_4$ and $N_2H_2$ as the main reactive gas, wherein $N_2H_2$ reacts with Tungsten (W) to form water-solutable residues; and
    (c) performing a water-rinsing process to dissolve the water-solutable residues.

2. The post-cleaning method as claimed in claim 1, wherein the flow rate of $CF_4$ is between 40 sccm and 200 sccm.

3. The post-cleaning method as claimed in claim 1, wherein the flow rate of $N_2H_2$ is between 100 sccm and 500 sccm.

4. The post-cleaning method as claimed in claim 1, wherein the proportion of $CF_4$ to the overall reactive gases is between ½ and ⅙.

5. The post-cleaning method as claimed in claim 1, wherein the dry cleaning process further uses inert gas as the main reactive gas.

6. The post-cleaning method as claimed in claim 1, wherein the water-rinsing process dips the wafer into deionized water.

7. The post-cleaning method as claimed in claim 1, wherein the oxide layer is made of TEOS-oxide.

8. The post-cleaning method as claimed in claim 1, wherein the photoresist strip process is a dry etching process.

9. The post-cleaning method as claimed in claim 1, wherein the photoresist strip process and the dry cleaning process are in-situ.

10. The post-cleaning method as claimed in claim 1, wherein the dry cleaning process uses dual powers.

11. The post-cleaning method as claimed in claim 10, wherein the dual powers comprises RF power and wave power.

12. The post-cleaning method as claimed in claim 11, wherein the RF power is between 80 W and 120 W.

13. The post-cleaning method as claimed in claim 11, wherein the wave power is between 700 W and 900 W.

* * * * *